(12) United States Patent
Shinoda

(10) Patent No.: US 10,388,339 B2
(45) Date of Patent: Aug. 20, 2019

(54) SEMICONDUCTOR MEMORY DEVICE AND DATA READING METHOD

(71) Applicant: LAPIS Semiconductor Co., Ltd., Yokohama (JP)

(72) Inventor: Tatsuru Shinoda, Yokohama (JP)

(73) Assignee: LAPIS Semiconductor Co., Ltd., Yokohama (JP)

(*) Notice: Subject to any disclaimer, the term of this patent is extended or adjusted under 35 U.S.C. 154(b) by 0 days.

(21) Appl. No.: 15/871,101

(22) Filed: Jan. 15, 2018

(65) Prior Publication Data
US 2018/0247681 A1    Aug. 30, 2018

(30) Foreign Application Priority Data

Feb. 28, 2017  (JP) ................................. 2017-037040

(51) Int. Cl.
| | | |
|---|---|---|
| G11C 11/34 | (2006.01) | |
| G11C 7/10 | (2006.01) | |
| G11C 16/26 | (2006.01) | |
| G11C 5/14 | (2006.01) | |

(52) U.S. Cl.
CPC ............ G11C 7/1057 (2013.01); G11C 11/34 (2013.01); G11C 16/26 (2013.01); *G11C 5/147* (2013.01)

(58) Field of Classification Search
CPC ........ G11C 11/34; G11C 16/26; G11C 7/1057
See application file for complete search history.

(56) References Cited

U.S. PATENT DOCUMENTS

| | | | | |
|---|---|---|---|---|
| 5,297,096 | A * | 3/1994 | Terada | G11C 16/16 365/185.06 |
| 2002/0039311 | A1* | 4/2002 | Takeuchi | G11C 16/20 365/185.09 |
| 2002/0048191 | A1* | 4/2002 | Ikehashi | G11C 29/006 365/185.22 |
| 2004/0090847 | A1* | 5/2004 | Takeuchi | G11C 16/20 365/200 |
| 2005/0125595 | A1* | 6/2005 | Takeuchi | G11C 16/20 711/103 |
| 2007/0140003 | A1* | 6/2007 | Ido | G11C 8/08 365/185.2 |

FOREIGN PATENT DOCUMENTS

JP    2002117692    4/2002

* cited by examiner

*Primary Examiner* — Toan K Le
(74) *Attorney, Agent, or Firm* — JCIPRNET

(57) ABSTRACT

A semiconductor memory device and a data reading method capable of appropriately reading data stored in memory cells are provided. The semiconductor memory device includes: a memory cell array including multiple memory cells and having a known-data storage area storing determination data used for determining appropriateness or inappropriateness of a value of each of a reading voltage applied to a memory cell when reading data stored in the memory cell and a comparative current used for a comparison with a current flowing through a memory cell according to stored data; a decoder that applies the reading voltage to a memory cell to be read according to an address representing the memory cell to be read; and a sense amplifier including a comparison circuit that outputs a comparison result acquired by comparing a current flowing through the memory cell to be read 66 according to stored data with the comparative current.

9 Claims, 12 Drawing Sheets

| SETTING SEQUENCE | READING VOLTAGE VALUE SETTING DATA | COMPARATIVE CURRENT VALUE SETTING DATA | COMPARATIVE CURRENT ADJUSTMENT VALUE SETTING DATA |
|---|---|---|---|
| 1 | $Vr\_1$ | $Ic\_1$ | $Ica\_1$ |
| 2 | $Vr\_2$ | $Ic\_2$ | $Ica\_2$ |
| 3 | $Vr\_3$ | $Ic\_3$ | $Ica\_3$ |
| ⋮ | ⋮ | ⋮ | ⋮ |

FIG. 4

| SETTING SEQUENCE | READING VOLTAGE VALUE SETTING DATA | COMPARATIVE CURRENT VALUE SETTING DATA | READING VOLTAGE ADJUSTMENT VALUE SETTING DATA |
|---|---|---|---|
| 1 | Vr_1 | Ic_1 | Vra_1 |
| 2 | Vr_2 | Ic_2 | Vra_2 |
| 3 | Vr_3 | Ic_3 | Vra_3 |

FIG. 12

SEMICONDUCTOR MEMORY DEVICE AND DATA READING METHOD

CROSS-REFERENCE TO RELATED APPLICATION

This application claims the priority benefit of Japan Application no. 2017-037040, filed on Feb. 28, 2017. The entirety of the above-mentioned patent application is hereby incorporated by reference herein and made a part of this specification.

BACKGROUND

Technical Field

The disclosure relates to a semiconductor memory device and a data reading method.

Description of Related Art

Conventionally, in a semiconductor memory device, information relating to bad sectors (unsound sectors), various initial values, various setting values, and the like are stored as initial setting data used at the time of inputting power or the like. In order to prevent data loss at the time of power shutoff, such initial setting data is required to be stored in a nonvolatile storage unit.

As a technology for storing initial setting data in a nonvolatile storage unit, for example, Japanese Patent Application Laid-Open (JP-A) No. 2002-117692 (Patent Document 1) describes a technology in which a memory cell array having nonvolatile memory cells arranged therein has an initial setting data area in which initial setting data is written. In the technology described in Patent Document 1, at the time of turning on the power or the like, by reading the initial setting data from the initial setting data area and setting (latching) the read data in various registers, initial setting is performed, and the memory cell array is operated.

Conventionally, in a semiconductor memory device, there are cases in which data stored in a memory cell cannot be appropriately read.

For this reason, in the technology described in Patent Document 1, status data representing whether or not the initial setting data area is normal is written into the initial setting data area, and the initial setting data is read while considering whether or not the initial setting data area is normal based on the status data.

However, in the technology described in Patent Document 1, for example, when at least one of a reading voltage applied to a memory cell at the time of reading data stored in the memory cell and a comparative current used for a comparison with a current flowing through the memory cell in accordance with stored data is inappropriate, there are cases in which data different from data stored in the memory cell is read. For this reason, there is a problem in that the technology described in Patent Document 1 is not sufficient for appropriately reading data stored in a memory cell.

SUMMARY

A semiconductor memory device according to an embodiment of the invention includes: a memory cell array that includes a plurality of memory cells and has a known-data storage area in which determination data used for determining appropriateness or inappropriateness of a value of each of a reading voltage applied to a memory cell at the time of reading data stored in the memory cell and a comparative current used for a comparison with a current flowing through a memory cell in accordance with stored data is stored; a decoder that applies the reading voltage to a memory cell to be read in accordance with an address representing the memory cell to be read from which data is to be read; and a comparison circuit that outputs a comparison result acquired by comparing a current flowing through the memory cell to be read in accordance with stored data with the comparative current.

In addition, a data reading method according to an embodiment is a method for reading data in a semiconductor memory device including: a memory cell array that includes a plurality of memory cells and has a known-data storage area in which determination data used for determining appropriateness or inappropriateness of a value of each of a reading voltage applied to a memory cell at the time of reading data stored in the memory cell and a comparative current used for a comparison with a current flowing through a memory cell in accordance with stored data is stored; a decoder that applies the reading voltage to a memory cell in accordance with an address representing the memory cell from which data is to be read; and a comparison circuit that outputs a comparison result acquired by comparing a current flowing through the memory cell in accordance with stored data with the comparative current. The data reading method includes performing the determination of the appropriateness or inappropriateness based on the comparison result at the time of reading the determination data; setting the reading voltage determined to be appropriate as a reading voltage to be applied by the decoder; and setting the comparative current determined to be appropriate as a comparative current to be compared by the comparison circuit.

BRIEF DESCRIPTION OF THE DRAWINGS

FIG. 4 is an explanatory diagram illustrating an example of a setting value table according to the first embodiment;

FIG. 12 is an explanatory diagram illustrating an example of a setting value table according to the second embodiment;

DESCRIPTION OF THE EMBODIMENTS

One or some exemplary embodiments of the invention provide a semiconductor memory device and a data reading method capable of appropriately reading data stored in a memory cell.

According to one or some exemplary embodiments of the invention, there is an effect of enabling appropriate reading of data stored in a memory cell.

Hereinafter, embodiments will be described in detail with reference to the drawings.

First Embodiment

Figure 1:
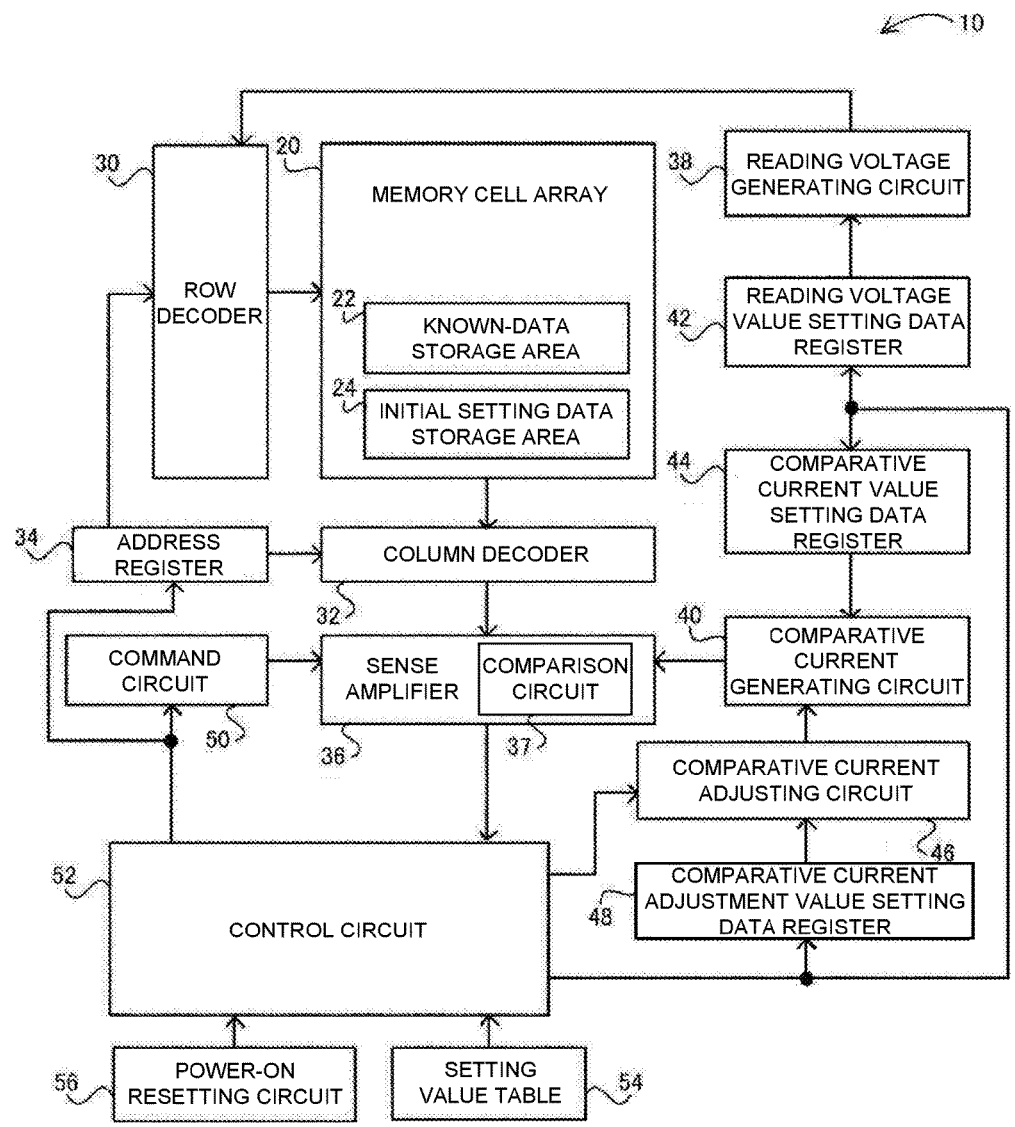
FIG. 1 is a configuration diagram schematically illustrating an example of a semiconductor memory device according to a first embodiment.

First, the configuration of a semiconductor memory device according to this embodiment will be described. FIG. 1 illustrates a configuration diagram schematically illustrating an example of the semiconductor memory device 10 according to this embodiment.

As illustrated in FIG. 1, the semiconductor memory device 10 according to this embodiment includes a nonvolatile memory cell array 20, a row decoder 30, a column decoder 32, an address register 34, a sense amplifier 36, a reading voltage generating circuit 38, a comparative current generating circuit 40, a reading voltage value setting data register 42, a comparative current value setting data register 44, a comparative current adjusting circuit 46, a comparative current adjustment value setting data register 48, a command circuit 50, and a control circuit 52.

Figure 2:
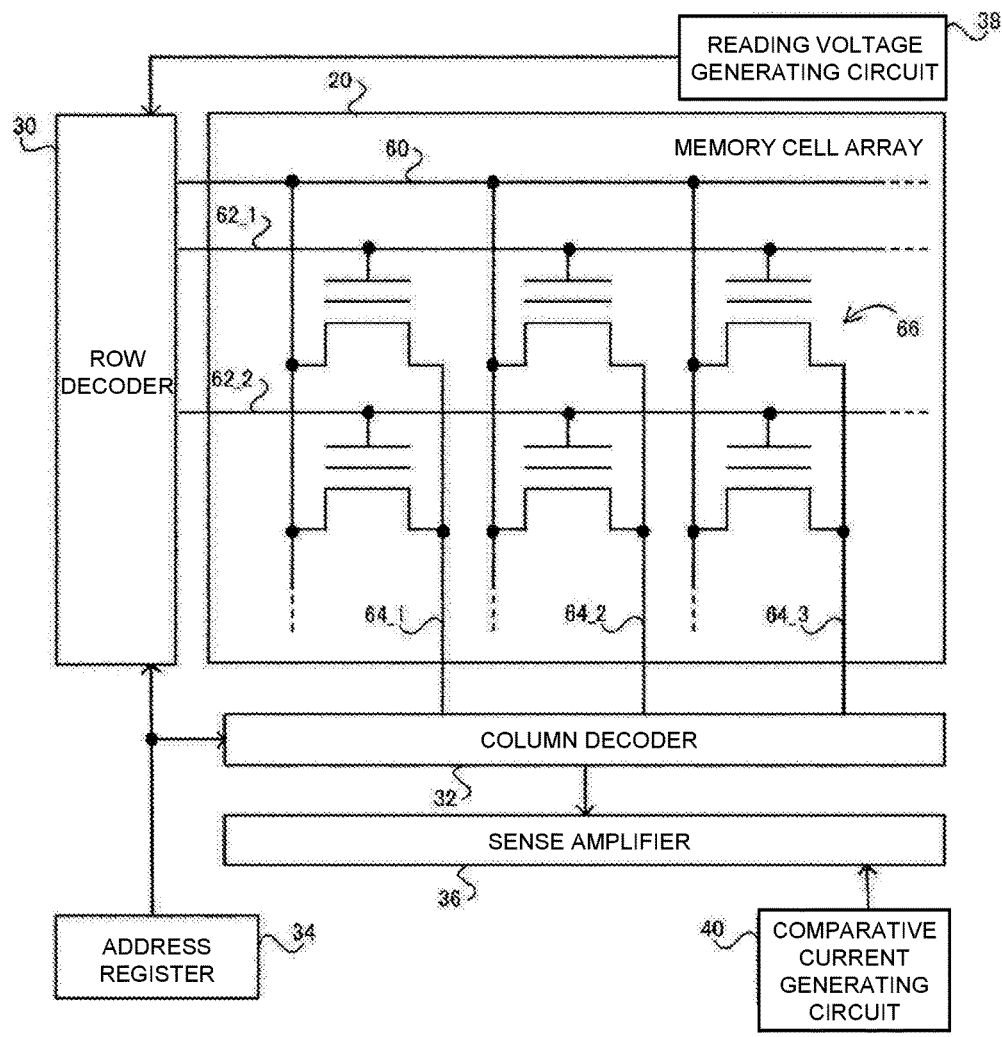
FIG. 2 is a configuration diagram illustrating an example of a memory cell array according to the first embodiment.

In this embodiment, the memory cell array 20 storing (holding) data is a nonvolatile memory, and as represented in the example illustrated in FIG. 2, a plurality of memory cells 66 of which stored data is electrically rewritable are arranged in a two-dimensional pattern (matrix pattern). As illustrated in FIG. 2, the memory cell array 20 according to this embodiment uses a metal-oxide-semiconductor (MOS) transistor having a floating gate as each of the memory cells 66. In this embodiment, a target memory cell 66 of which stored data is read will also be referred to as a memory cell to be read 66.

As illustrated in FIG. 2, in the memory cell array 20, a cell bias line 60, a plurality of word lines 62 (in FIGS. 2, 62_1 and 62_2), and a plurality of bit lines 64 (in FIGS. 2, 64_1, 64_2, and 64_3) are disposed. The word lines 62 and the bit lines 64 are arranged in accordance with the arrangement of the memory cells 66, and in the example illustrated in FIG. 2, a word line 62 is disposed for each row in which the memory cells 66 are arranged, and a bit line 64 is disposed for each column. In the memory cell array 20 illustrated in FIG. 2, although a case in which six memory cells 66 are disposed in two rows×three columns with two word lines 62 (62_1 and 62_2) and three bit lines 64 (64_1, 64_2, and 64_3) is illustrated as an example, the number, the arrangement, and the like of memory cells 66 are not limited thereto.

The cell bias line 60 and the word lines 62 are connected to the row decoder 30, and the bit lines 64 are connected to the column decoder 32. In addition, the drain or the source of each memory cell 66 is connected to the cell bias line 60. In addition, the gate of the memory cell 66 is connected to the word line 62. In addition, the source or the drain of the memory cell 66 is connected to the bit line 64.

As illustrated in FIG. 1, the memory cell array 20 according to this embodiment includes an initial setting data storage area 24. The initial setting data storage area 24 is an area including a plurality of memory cells 66 in which initial setting data for operating the memory cell array 20 is stored. The initial setting data is not particularly limited and may include, for example, information relating to bad sectors (unsound sectors), various initial values, and the like. In addition, as an example, the initial setting data according to this embodiment includes a reading voltage and a comparative current value (hereinafter referred to as a "normal reading voltage" and a "normal comparative voltage value") used when data is read from a memory cell 66 disposed in an area other than a known-data storage area 22 and the initial setting data storage area 24.

As illustrated in FIG. 1, the memory cell array 20 according to this embodiment includes the known-data storage area 22. The known-data storage area 22 is an area including a plurality of memory cells 66 in which predetermined determination data (hereinafter, simply referred to as "determination data"), which is known data and used for determining appropriateness or inappropriateness of the reading voltage and the comparative current value is stored. In the known-data storage area 22, for example, determination data used for detecting conditions such as a reading voltage for reading initial setting data stored in the initial setting data storage area 24, a comparative current value, and the like is stored. The determination data stored in the known-data storage area 22 is a plurality of pieces of data having different logic values, and in the semiconductor memory device 10 according to this embodiment, as an example of the determination data, data having a logic value of "1" and data having a logic value of "0" are used. The determination data having the logic value of "1" according to this embodiment is an example of first data of the present disclosure, and the determination data having a logic value of "0" according to this embodiment is an example of second data of the present disclosure.

In the semiconductor memory device 10 according to this embodiment, normal data (data other than the determination data and the initial setting data) is stored in memory cells 66 disposed in an area other than the known-data storage area 22 and the initial setting data storage area 24. In addition, in the semiconductor memory device 10 according to this embodiment, while data stored in the known-data storage area 22 and the initial setting data storage area 24 can be overwritten and erased, when a normal operation is performed, data overwriting and data erasing for the known-data storage area 22 and the initial setting data storage area 24 are not performed.

The control circuit 52 has a function of controlling the overall operation of the semiconductor memory device 10 for performing data writing, data reading, and data erasing on the memory cell array 20. In addition, the control circuit 52 has a function of determining appropriateness or inappropriateness of a reading voltage and a comparative current used when the initial setting data stored in the initial setting data storage area 24 is read. Furthermore, the control circuit 52 according to this embodiment has a function of performing initial setting by reading initial data stored in the initial setting data storage area 24 using a reading voltage and a comparative current value determined to be appropriate when the semiconductor memory device 10 is powered on.

As such a control circuit 52, for example, a micro control unit (MCU), a central processing unit (CPU), or the like may be used, but the control circuit 52 is not limited thereto.

As illustrated in FIG. 1, the address register 34, the sense amplifier 36, the reading voltage value setting data register 42, the comparative current value setting data register 44, the comparative current adjusting circuit 46, the comparative current adjustment value setting data register 48, the command circuit 50, and a power-on resetting circuit 56 are connected to the control circuit 52.

The control circuit 52, in the setting sequence, outputs setting data read from a setting value table 54 (see FIG. 4; to be described in detail later) that defines combinations of reading voltage value setting data, comparative current value setting data, and comparative current adjustment value setting data in association with each other to the reading voltage value setting data register 42, the comparative current value setting data register 44, and the comparative current adjustment value setting data register 48. In this embodiment, as an example, the setting value table 54 is stored in a memory unit that is not illustrated in the drawing, and the memory unit is connected to the control circuit 52. In addition, the memory unit storing the setting value table 54 may be disposed either inside or outside of the semiconductor memory device 10.

In the reading voltage value setting data register 42, reading voltage value setting data output from the control circuit 52 is set. The reading voltage value setting data register 42 outputs the set reading voltage value setting data to the reading voltage generating circuit 38, and the reading voltage generating circuit 38 generates a reading voltage in accordance with the input reading voltage value setting data and outputs the generated reading voltage to the row decoder 30.

In the address register 34, a signal representing an address of the memory cell array 20 output from the control circuit 52 is set. The address register 34 outputs the set address to the row decoder 30 and the column decoder 32.

The row decoder 30 selects a cell bias line 60 and a word line 62 in accordance with an address input from the address register 34 and applies a reading voltage input from the reading voltage generating circuit 38 to the bias line 60 and the word line 62 that have been selected.

The column decoder 32 selects a bit line 64 in accordance with an address input from the address register 34 and connects the selected bit line 64 to the sense amplifier 36.

A read command output from the control circuit 52 is input to the command circuit 50. The command circuit 50 causes the sense amplifier 36 to be in an active state based on the read command.

In the comparative current value setting data register 44, comparative current value setting data output from the control circuit 52 is set. The comparative current value setting data register 44 outputs the set comparative current value setting data to the comparative current generating circuit 40.

In the comparative current adjustment value setting data register 48, comparative current adjustment value setting data output from the control circuit 52 is set. The comparative current adjustment value setting data register 48 outputs the set comparative current adjustment value setting data to the comparative current adjusting circuit 46. The comparative current adjusting circuit 46, in accordance with an adjustment instruction signal input from the control circuit 52, determines an adjustment value of a comparative current according to the comparative current adjustment value setting data input from the comparative current adjustment value setting data register 48 and outputs the determined adjustment value to the comparative current generating circuit 40.

The comparative current generating circuit 40 generates a comparative current according to the comparative current value setting data input from the comparative current value setting data register 44, and when an adjustment value of the comparative current is input from the comparative current adjusting circuit 46, outputs a comparative current adjusted in accordance with the input adjustment value to the sense amplifier 36.

As the sense amplifier 36 is caused to be in an active state by the command circuit 50, a current path from the cell bias line 60 that passes through the bit line 64 selected by the column decoder 32 through the memory cell to be read 66 is formed. As illustrated in FIG. 1, the sense amplifier 36 according to this embodiment includes a comparison circuit 37. Based on a result of comparison between a current flowing through the selected bit line 64 and a comparative current output from the comparative current generating circuit 40 that is performed by the comparison circuit 37, the sense amplifier 36 determines a logic value of the determination data stored in the known-data storage area 22 to be one of "1" and "0" and outputs a result of the determination to the control circuit 52.

Figure 3:
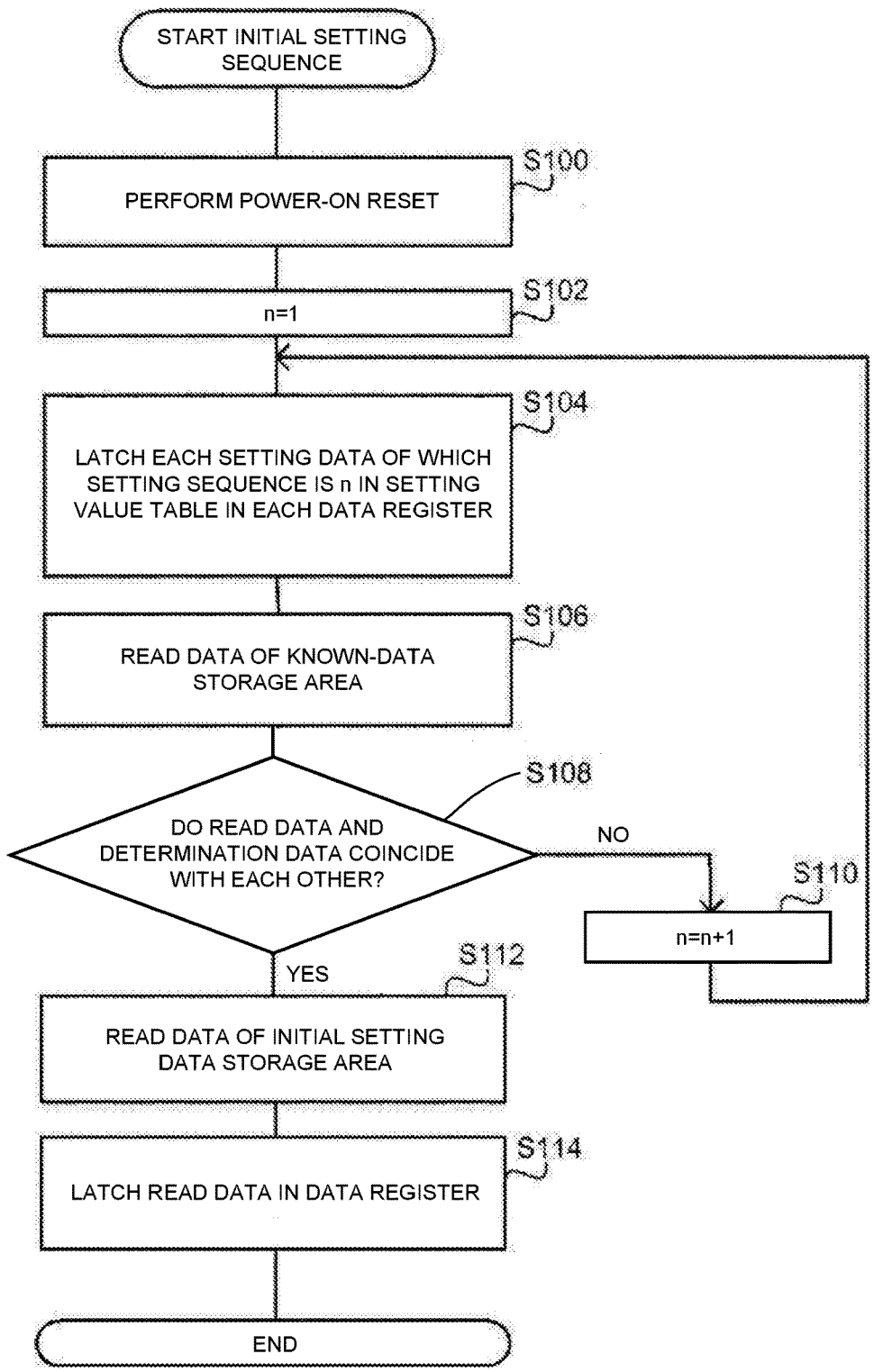
FIG. 3 is a flowchart illustrating an example of the flow of an initial setting sequence executed by the semiconductor memory device according to the first embodiment.

In the semiconductor memory device 10 according to this embodiment, when the semiconductor memory device 10 is powered on, a sequence (initial setting sequence) for executing initial setting illustrated in FIG. 3 as an example is performed. FIG. 3 is a flowchart illustrating an example of the flow of the initial setting sequence according to this embodiment.

First, in Step S100, the semiconductor memory device 10 performs power-on reset using the power-on resetting circuit 56. The power-on resetting circuit 56 detects a rise in an external power source installed outside the semiconductor memory device 10 and outputs a reset signal used for causing the control circuit 52 to be in a reset state to the control circuit 52. The control circuit 52 stands by in the reset state in accordance with the reset signal. Thereafter, when a voltage supplied from the external power source reaches a predetermined height (magnitude), the power-on resetting circuit 56 outputs a reset signal used for releasing the reset state to the control circuit 52. Accordingly, the control circuit 52 releases the reset state.

Next, in Step S102, the control circuit 52 of the semiconductor memory device 10 sets a variable n representing the setting sequence (n=1) to "1".

Next, in Step S104, the control circuit 52 reads setting data of which the setting sequence is n from the setting value table 54 and latches (sets) the setting data in each data register. In addition, the control circuit 52 according to this embodiment outputs an adjustment instruction signal used for performing adjustment of a comparative current to the comparative current adjusting circuit 46.

In the setting value table 54 according to this embodiment, as illustrated in FIG. 4, a combination of reading voltage value setting data, comparative current value setting data, and comparative current adjustment value setting data is defined in association with a setting sequence (n). Here, the number of combinations defined in the setting value table 54 is not particularly limited. In addition, regarding the combination of the reading voltage value setting data, the comparative current value setting data, and the comparative current adjustment value setting data defined in the setting value table 54, the same value may be included in different combinations if any one of these three types of setting data is different. For example, in the setting value table 54 as illustrated in FIG. 4, in three combinations having a setting sequence "1" (n=1) to a setting sequence "3" (n=3), the reading voltage value setting data Vr_1 to Vr_3 may have the same value, the comparative current value setting data Ic_1 to Ic_2 may have different values, and the comparative current adjustment value setting data may have the same value.

For example, when the process of Step S104 is performed for the first time after the initial sequence is started, that is, when n=1, the control circuit 52 reads the reading voltage value setting data Vr_1 of which the setting sequence is "1" from the setting value table 54 and sets (latches) the read reading voltage value setting data in the reading voltage value setting data register 42.

Accordingly, the reading voltage generating circuit 38 generates a reading voltage corresponding to the reading voltage value setting data set in the reading voltage value setting data register 42 and outputs the generated reading voltage to the row decoder 30.

In addition, the control circuit 52 reads the comparative current value setting data Ic_1 of which the setting sequence is "1" from the setting value table 54 and sets (latches) the read comparative current value setting data Ic1 in the comparative current value setting data register 44. Furthermore, the control circuit 52 reads the comparative current adjustment value setting data Ica_1 of which the setting sequence is "1" from the setting value table 54 and sets (latches) the read comparative current adjustment value setting data Ica_1 in the comparative current adjustment value setting data register 48.

In this way, the comparative current adjusting circuit 46 determines an adjustment value corresponding to the comparative current adjustment value setting data set in the comparative current adjustment value setting data register 48 based on an adjustment instruction signal and outputs the determined adjustment value to the comparative current generating circuit 40. Meanwhile, the comparative current generating circuit 40 adjusts (increases or decreases) a comparative current corresponding to the comparative current value setting data set in the comparative current value setting data register 44 using the adjustment value determined by the comparative current adjusting circuit 46 to generate an adjusted comparative current and outputs the generated adjusted comparative current to the sense amplifier 36.

More specifically, the comparative current adjusting circuit 46 according to this embodiment increases (increases the current value of) the comparative current Ic corresponding to the comparative current value setting data using the adjustment value, thereby generating a comparative current Ic1. The comparative current Ic1 is used for a comparison with a current flowing through a memory cell 66 storing determination data of which the logic value is "1" (to be described later in detail). In addition, the comparative current adjusting circuit 46 according to this embodiment decreases (decreases the current value of) the comparative current Ic corresponding to comparative current value setting data using the adjustment value, thereby generating a comparative current Ic0. The comparative current Ic0 is used for a comparison with a current flowing through a memory cell 66 storing determination data of which the logic value is "0" (to be described later in detail). The comparative current Ic1 according to this embodiment is an example of a first comparative current according to the present disclosure, and the comparative current Ic0 according to this embodiment is an example of a second comparative current according to the present disclosure.

Next, in Step S106, the control circuit 52 reads determination data from the known data storage area 22 of the memory cell array 20.

Figure 5:
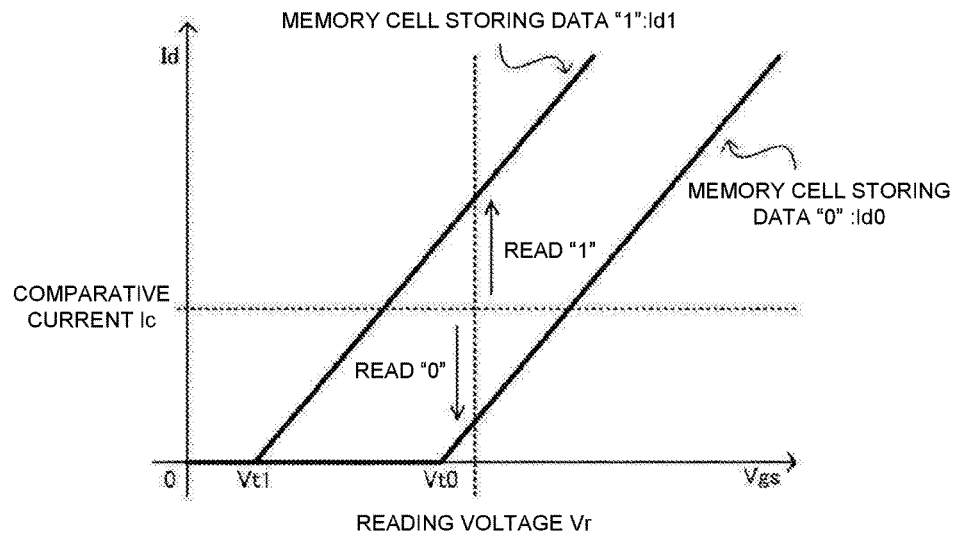
FIG. 5 is a diagram illustrating an example of a relation between Id-Vgs characteristics of a memory cell and a comparative current Ic.

Here, a determination method used by the sense amplifier 36 for determining a logic value of data stored in the memory cell to be read 66 in the semiconductor memory device 10 according to this embodiment will be described with reference to FIG. 5. FIG. 5 illustrates an example of a relation between the Id-Vgs characteristics of the memory cell 66 and the comparative current Ic. It is assumed that there is a potential difference between the drain and the source of the memory cell 66. In this embodiment, a current flowing through the drain of the memory cell 66 will be denoted by a current Id, and a voltage that is a potential difference between the gate and the source of the memory cell 66 and corresponds to a reading voltage will be denoted by a voltage Vgs. The memory cell 66 has a characteristic in which the threshold can be changed by an electric operation, and the state can be maintained without consuming power. In the semiconductor memory device 10 according to this embodiment, the threshold Vt1 of the memory cell 66 storing data having a logic value "1" is configured to be lower than the threshold Vt0 of the memory cell 66 storing data having a logic value "0."

As illustrated in FIG. 5, when the voltage Vgs of the memory cell 66 becomes higher than the threshold Vt1, a current Id1 flowing through the memory cell 66 storing data having a logic value "1" is higher than a current Id0 flowing through the memory cell 66 storing data having a logic value "0." Here, for example, when the comparative current Ic is set to be an intermediate value between the current Id1 and the current Id0, the sense amplifier 36 can determine the logic value of read data to be "1" if the current Id is equal to or greater than the comparative current Ic and determine the logic value of read data to be "0" if the current Id is less than the comparative current Ic.

Next, a method of determining a logic value in the sense amplifier 36 when the comparative current Ic is adjusted using the adjustment value output from the comparative current adjusting circuit 46 will be described with reference to FIGS. 6 to 10. When determination data having a logic value "1" is read, the semiconductor memory device 10 according to this embodiment uses a comparative current Ic1 (Ic<Ic1) acquired by performing adjustment of driving the comparative current Ic to a side on which the current value increases in accordance with the adjustment value. On the other hand, when determination data having a logic value "0" is read, the semiconductor memory device 10 uses a comparative current Ic0 (Ic>Ic0) acquired by performing adjustment of driving the comparative current Ic to a side on which the current value decreases in accordance with the adjustment value.

Figure 6:
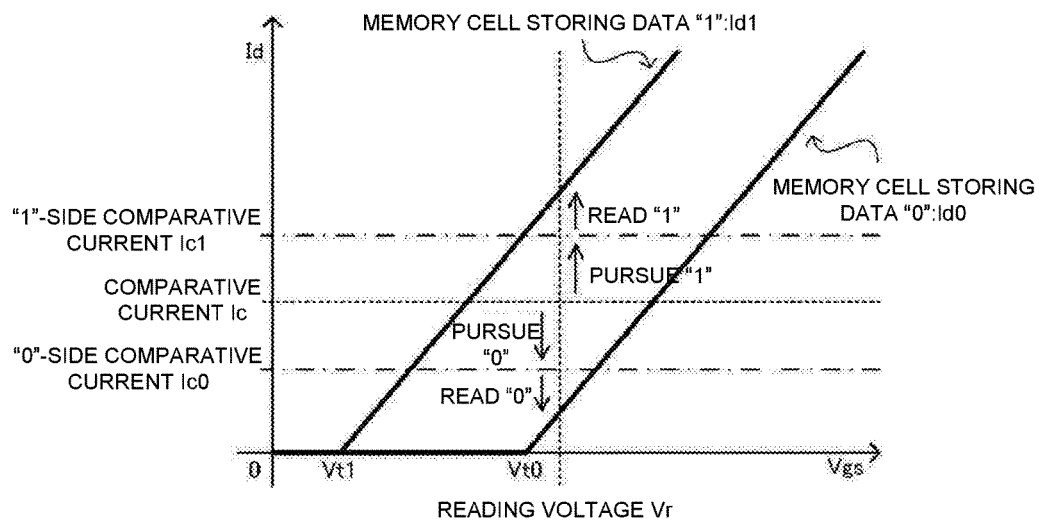
FIG. 6 is a diagram illustrating an example of a relation between Id-Vgs characteristics of a memory cell and comparative currents Ic, Ic1, and Ic0 when the comparative current Ic and a reading voltage Vr are appropriate.

FIG. 6 illustrates an example of a relation between Id-Vgs characteristics of the memory cell 66 and the comparative currents Ic, Ic1, and Ic0 when the comparative current Ic and the reading voltage Vr are appropriate. As illustrated in FIG. 6, when the reading voltage Vr is applied, the current Id1 flowing through the memory cell 66 storing data having a logic value "1" is equal to or greater than the comparative current Ic1, and accordingly, the sense amplifier 36 determines that the logic value of the read data is "1." On the other hand, the current Id0 flowing through the memory cell 66 storing data having a logic value "0" is less than the comparative current Ic0, and accordingly, the sense amplifier 36 determines that the logic value of the read data is "0." In this way, as illustrated in FIG. 6, when the comparative current Ic and the reading voltage Vr are appropriate, an actual logic value of data stored in the memory cell 66 and the logic value of read data coincide with each other.

Figure 7:
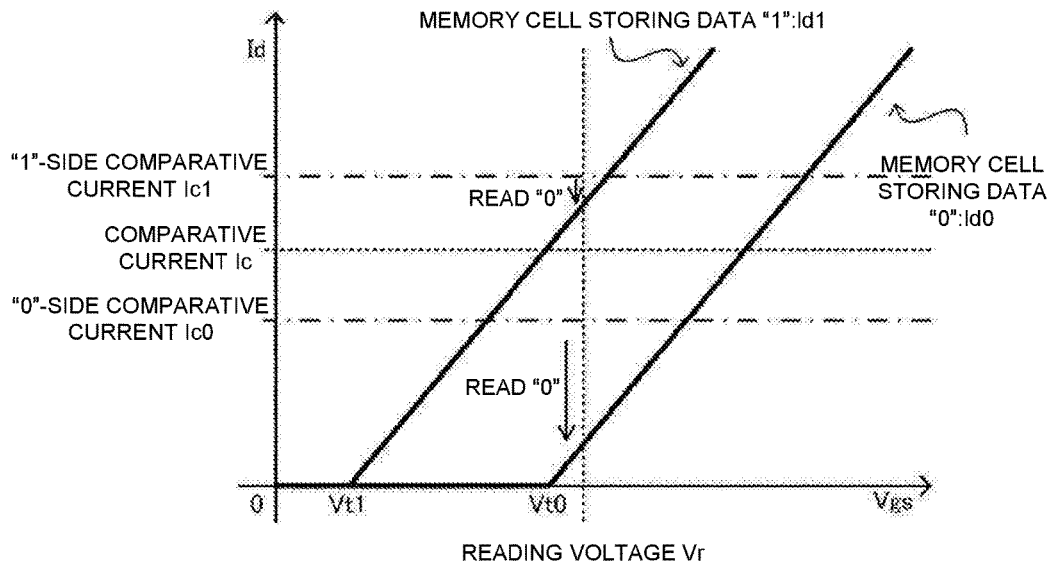
FIG. 7 is a diagram illustrating an example of a relation between Id-Vgs characteristics of a memory cell and comparative currents Ic, Ic1, and Ic0 when the comparative current Ic has a value larger than an appropriate value.

FIG. 7 illustrates an example of a relation between Id-Vgs characteristics of the memory cell 66 and the comparative currents Ic, Ic1, and Ic0 when the comparative current Ic has a value larger than an appropriate value. As illustrated in FIG. 7, when a reading voltage Vr is applied, a current Id1 flowing through the memory cell 66 storing data of a logic value "1" is less than the comparative current Ic1, and accordingly, the sense amplifier 36 determines that the logic value of the read data is "0." In addition, a current Id0 flowing through the memory cell 66 storing data of a logic value "0" is less than the comparative current Ic0, and accordingly, the sense amplifier 36 determines that the logic value of the read data is "0." In this way, in the case as illustrated in FIG. 7, the actual logic value ("1") of the data stored in the memory cell 66 and the logic value of the read data do not coincide with each other.

Figure 8:
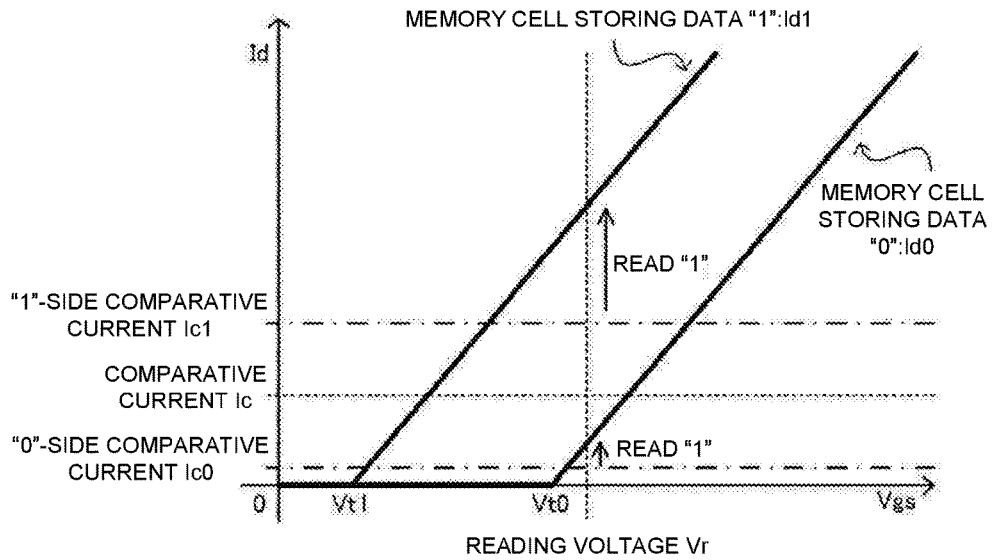
FIG. 8 is a diagram illustrating an example of a relation between Id-Vgs characteristics of a memory cell and comparative currents Ic, Ic1, and Ic0 when the comparative current Ic has a value smaller than an appropriate value.

FIG. 8 illustrates an example of a relation between Id-Vgs characteristics of the memory cell 66 and the comparative currents Ic, Ic1, and Ic0 when the comparative current Ic has a value smaller than an appropriate value. As illustrated in FIG. 8, when a reading voltage Vr is applied, a current Id1 flowing through the memory cell 66 storing data of a logic value "1" is equal to or greater than the comparative current Ic1, and accordingly, the sense amplifier 36 determines that the logic value of the read data is "1." In addition, a current Id0 flowing through the memory cell 66 storing data of a logic value "0" is equal to or greater than the comparative current Ic0, and accordingly, the sense amplifier 36 determines that the logic value of the read data is "1." In this way, in the case as illustrated in FIG. 8, the actual logic value ("0") of the data stored in the memory cell 66 and the logic value of the read data do not coincide with each other.

Figure 9:
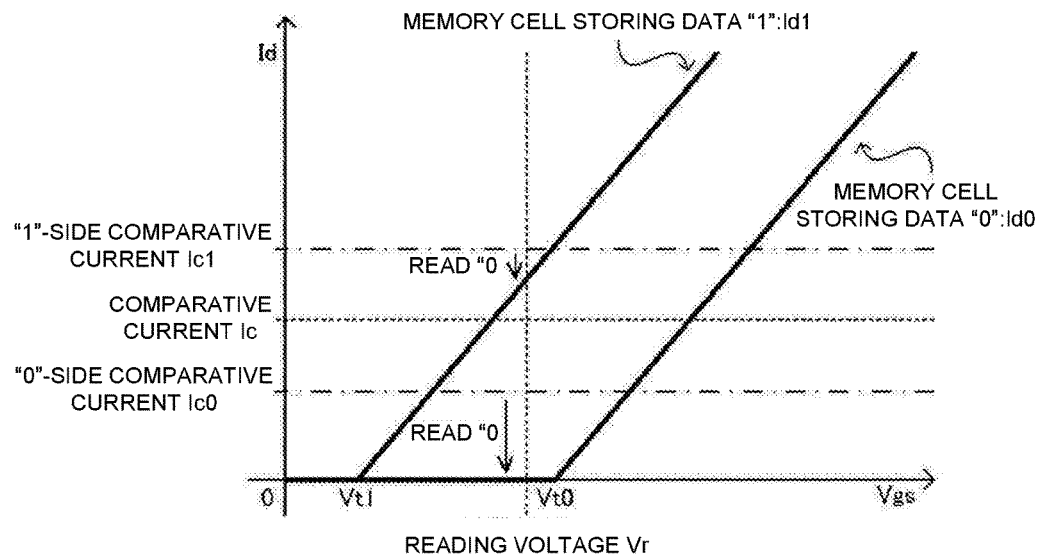
FIG. 9 is a diagram illustrating an example of a relation between Id-Vgs characteristics of a memory cell and comparative currents Ic, Ic1, and Ic0 when the reading voltage Vr has a value smaller than an appropriate value.

FIG. 9 illustrates an example of a relation between Id-Vgs characteristics of the memory cell 66 and the comparative currents Ic, Ic1, and Ic0 when the reading voltage Vr has a value smaller than an appropriate value. As illustrated in FIG. 9, when the reading voltage Vr is applied, a current Id1 flowing through the memory cell 66 storing data of a logic value "1" is less than the comparative current Ic1, and accordingly, the sense amplifier 36 determines that the logic value of the read data is "0." In addition, a current Id0 flowing through the memory cell 66 storing data of a logic value "0" is less than the comparative current Ic0, and accordingly, the sense amplifier 36 determines that the logic value of the read data is "0." In this way, in the case as illustrated in FIG. 9, the actual logic value ("1") of the data stored in the memory cell 66 and the logic value of the read data do not coincide with each other.

Figure 10:
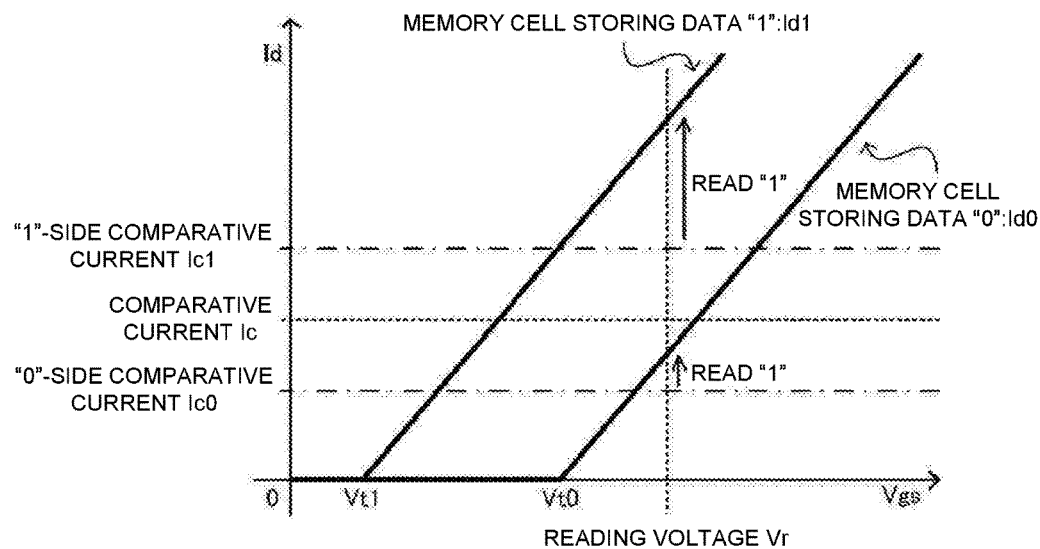
FIG. 10 is a diagram illustrating an example of a relation between Id-Vgs characteristics of a memory cell and comparative currents Ic, Ic1, and Ic0 when the reading voltage Vr has a value larger than an appropriate value.

In addition, FIG. 10 illustrates an example of a relation between Id-Vgs characteristics of the memory cell 66 and the comparative currents Ic, Ic1, and Ic0 when the reading voltage Vr has a value larger than an appropriate value. As illustrated in FIG. 10, when the reading voltage Vr is applied, a current Id1 flowing through the memory cell 66 storing data of a logic value "1" is equal to or greater than the comparative current Ic1, and accordingly, the sense amplifier 36 determines that the logic value of the read data is "1." In addition, a current Id0 flowing through the memory cell 66 storing data of a logic value "0" is equal to or greater than the comparative current Ic0, and accordingly, the sense amplifier 36 determines that the logic value of the read data is "1." In this way, in the case as illustrated in FIG. 10, the actual logic value ("0") of the data stored in the memory cell 66 and the logic value of the read data do not coincide with each other.

As described with reference to FIGS. 6 to 10, according to the semiconductor memory device 10 of this embodiment, by adjusting the comparative current Ic using the adjustment value output from the comparative current adjusting circuit 46, when the actual logic value of the data stored in the memory cell 66 and the logic value (the logic value of the read data) determined by the sense amplifier 36 do not coincide with each other, it can be determined that at least one of the comparative current Ic and the reading voltage Vr is not appropriate.

As the adjustment value becomes larger, the actual logic value of the data stored in the memory cell 66 and the logic value (the logic value of the read data) determined by the sense amplifier 36 are less likely to coincide with each other. For this reason, as the adjustment value becomes larger, the determination of appropriateness or inappropriateness becomes stricter. The adjustment value, for example, may be determined in accordance with the specification of the memory cell array 20, an allowed range of an error in the reading voltage Vr, an allowed range of an error in the comparative current Ic, and the like.

In this Step S106, more specifically, when determination data having a logic value "1" is read, the control circuit 52 outputs a signal indicating the address of the memory cell 66 in which the determination data having the logic value "1" is stored to the address register 34 and outputs a read command to the command circuit 50. The row decoder 30 applies the reading voltage Vr to a cell bias line 60 and a word line 62 corresponding to the address of the address register 34. The column decoder 32 selects a bit line 64 corresponding to the address of the address register 34 and connects the selected bit line 64 to the sense amplifier 36. The comparison circuit 37 of the sense amplifier 36 compares the comparative current Ic1 with the current Id1 flowing through the memory cell 66. The sense amplifier 36 determines that the logic value of the read data is "1" when the current Id1 flowing through the memory cell 66 is equal to or greater than the comparative current Ic1 and determines that the logic value of the read data is "0" when the current Id1 is less than the comparative current Ic1. In this embodiment, a comparison result acquired by the comparison circuit 37 of this case is an example of a first comparison result according to the present disclosure.

In addition, when determination data having a logic value "0" is read, the control circuit 52 outputs a signal indicating the address of the memory cell 66 in which the determination data having the logic value "0" is stored to the address register 34 and outputs a read command to the command circuit 50. The row decoder 30 applies the reading voltage Vr to a cell bias line 60 and a word line 62 corresponding to the address of the address register 34. The column decoder 32 selects a bit line 64 corresponding to the address of the address register 34 and connects the selected bit line 64 to the sense amplifier 36. The comparison circuit 37 of the sense amplifier 36 compares the comparative current Ic0 with the current Id0 flowing through the memory cell 66. The sense amplifier 36 determines that the logic value of the read data is "0" when the current Id0 flowing through the memory cell 66 is less than the comparative current Ic0 and determines that the logic value of the read data is "1" when the current Id0 is equal to or greater than the comparative current Ic0. In this embodiment, a comparison result acquired by the comparison circuit 37 of this case is an example of a second comparison result according to the present disclosure.

In the next Step S108, the control circuit 52 determines whether or not the logic value (the logic value determined by the sense amplifier 36) of the read data and the actual logic value of the determination data stored in the read memory cell 66 coincide with each other.

In at least one of the determination data having the logic value "1" and the determination data having the logic value "0," when the logic value determined by the sense amplifier 36 and the actual logic value of the determination data stored in the read memory cell 66 do not coincide with each other, a result of the determination of Step S108 is "No," and the process proceeds to the process of Step S110.

In Step S110, after the control circuit 52 adds "1" to the variable n representing the setting sequence (n=n+1), the process is returned to Step S104. Accordingly, the processes of Step S106 and Step S108 are repeated using the reading voltage value setting data, the comparative current value setting data, and the comparative current adjustment value setting data associated with the next setting sequence from the setting value table 54.

On the other hand, in both the determination data having the logic value "1" and the determination data having the logic value "0," when the logic value determined by the sense amplifier 36 and the actual logic value of the determination data stored in the read memory cell 66 coincide with each other, a result of the determination of Step S108 is "Yes," and the process proceeds to the process of Step S112.

In Step S112, the control circuit 52 reads the initial setting data stored in the initial setting data storage area 24 using the reading voltage and the comparative current value used when the logic value determined by the sense amplifier 36 and the actual logical value of the determination data stored in the read memory cell 66 coincide with each other in Step S108. In this embodiment, the control circuit 52 outputs a signal indicating the address of the initial setting data storage area 24 to the address register 34. Accordingly, the reading voltage Vr output from the reading voltage generating circuit 38 is applied from the row decoder 30 to a cell bias line 60 and a word line 62 corresponding to the memory cell 66 of the initial setting data storage area 24.

In addition, the control circuit 52 outputs an adjustment instruction signal used for stopping the adjustment of the comparative current Ic to the comparative current adjusting circuit 46. In this way, the sense amplifier 36 determines a logic value based on a result of the comparison of comparing the current Id flowing through the memory cell 66 of the initial setting data storage area 24 with the comparative current Ic by the comparison circuit 37 and outputs a result of the determination to the control circuit 52.

In the semiconductor memory device 10 according to this embodiment, by reading the initial setting data stored in the initial setting data storage area 24 in this way, the value of the normal read voltage and the value of the normal comparative current included in the initial setting data are read.

In the next Step S114, the control circuit 52 latches (sets) the value of the read normal reading voltage in the reading voltage value setting data register 42, latches (sets) the value of the normal comparative current in the comparative current generating circuit 40, and then ends this initial setting sequence.

By executing the initial setting sequence in this way, in the semiconductor memory device 10 according to this embodiment, after the execution of the initial setting sequence, the data stored in the memory cell 66 of the memory cell array 20 is read using the normal reading voltage and the normal comparative current.

In this way, the semiconductor memory device 10 according to this embodiment determines the appropriateness or inappropriateness of the determination data stored in the known-data storage area 22 in the initial sequence. When the logic value of the determination data is "1," the comparative current generating circuit 40 generates a comparative current Ic1 acquired by performing adjustment of increasing the comparative current Ic based on the adjustment value. The comparison circuit 37 of the sense amplifier 36 compares the current Id1 flowing through the memory cell 66 in which the determination data having the logical value "1" is stored with the comparative current Ic1. The sense amplifier 36 determines that the logic value of the read data is "1" when the current Id1 is equal to or greater than the comparative current Ic1 and determines that the logic value of the read data is "0" when the current Id1 is less than the comparative current Ic1.

In addition, when the logic value of the determination data is "0," the comparative current generating circuit 40 generates a comparative current Ic0 acquired by performing adjustment of decreasing the comparative current Ic based on the adjustment value. The comparison circuit 37 of the sense amplifier 36 compares the current Id0 flowing through the memory cell 66 in which the determination data having the logical value "0" is stored with the comparative current Ic0. The sense amplifier 36 determines that the logic value of the read data is "0" when the current Id0 is less than the comparative current Ic0 and determines that the logic value of the read data is "1" when the current Id0 is equal to or greater than the current Ic0.

In both the case in which the logic value of the determination data is "1" and the case in which the logic value of the determination value is "0," when the actual logic value of the determination data and the logic value of the read data determined by the sense amplifier 36 coincide with each other, the control circuit 52 determines that the comparative current Ic and the reading voltage Vr are appropriate. The data stored in the initial setting data storage area is read using the comparative current Ic and the reading voltage Vr that have been determined to be appropriate, and various initial settings are performed.

Second Embodiment

In the first embodiment described above, the determination of the appropriateness or inappropriateness of the reading voltage Vr and the comparative current Ic is performed by reading the determination data stored in the known-data storage area 22 using the comparative current Ic1 and the comparative current Ic0 acquired by adjusting the comparative current Ic using the adjustment value Ic. In this embodiment, a case in which the determination of the appropriateness or inappropriateness of the reading voltage Vr and the comparative current Ic is performed by adjusting the reading voltage Vr using an adjustment value instead of adjusting the comparative current Ic will be described.

Figure 11:
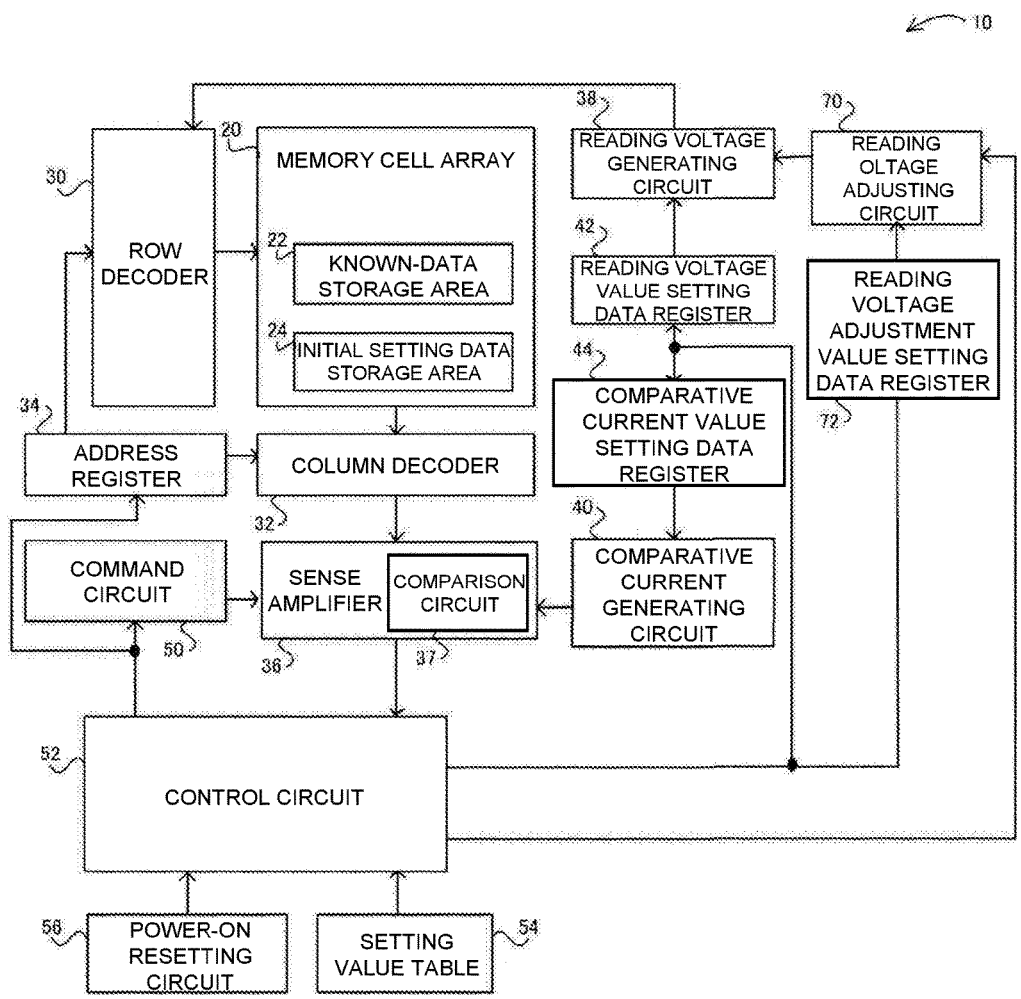
FIG. 11 is a configuration diagram schematically illustrating an example of a semiconductor memory device according to a second embodiment.

FIG. 11 illustrates a configuration diagram schematically illustrating an example of a semiconductor memory device 10 according to this embodiment. As illustrated in FIG. 11, the semiconductor memory device 10 according to this embodiment includes a reading voltage adjusting circuit 70 and a reading voltage adjustment value setting data register 72 instead of the comparative current adjusting circuit 46 and the comparative current adjustment value setting data register 48 included in the semiconductor memory device 10 (see FIG. 1) according to the first embodiment, which is different from that according to the first embodiment.

The reading voltage adjusting circuit 70 and the reading voltage adjustment value setting data register 72 are connected to a control circuit 52. In the reading voltage adjustment value setting data register 72, reading voltage adjustment value setting data output from the control circuit 52 is set. The reading voltage adjustment value setting data register 72 outputs the set reading voltage adjustment value setting data to the reading voltage adjusting circuit 70. In accordance with an adjustment instruction signal input from the control circuit 52, the reading voltage adjusting circuit 70 determines an adjustment value of the reading voltage corresponding to the reading voltage adjustment value setting data input from the reading voltage adjustment value setting data register 72 and outputs the determined adjustment value to a reading voltage generating circuit 38.

The reading voltage generating circuit 38 according to this embodiment generates a reading voltage corresponding to the reading voltage value setting data input from a reading voltage value setting data register 42, and when the adjustment value of the reading voltage is input from the reading voltage adjusting circuit 70, outputs a reading voltage adjusted in accordance with the input adjustment value to a row decoder 30.

In this way, in the semiconductor memory device 10 according to this embodiment, since the control circuit 52 sets the reading voltage value setting data in the reading voltage adjustment value setting data register 72, as illustrated in FIG. 12, a setting value table 54 used for the setting is different from the setting value table 54 (see FIG. 4) according to the first embodiment. The setting value table 54 according to this embodiment, as illustrated in FIG. 12, defines a combination of reading voltage value setting data, comparative current value setting data, and reading voltage adjustment value setting data in association with a setting sequence (n).

Next, a method of determining a logic value in the sense amplifier 36 when a reading voltage Vr is adjusted using an adjustment value output from the reading voltage adjusting circuit 70 in the semiconductor memory device 10 according to this embodiment will be described with reference to FIGS. 13 to 17. When determination data having a logic value "1" is read, the semiconductor memory device 10 according to this embodiment uses a reading voltage Vr1 (Vr1<Vr) acquired by performing adjustment of driving the reading voltage Vr to a side on which the voltage value decreases in accordance with the adjustment value. On the other hand, when determination data having a logic value "0" is read, the semiconductor memory device 10 uses a reading voltage Vr0 (Vr0>Vr) acquired by performing adjustment of driving the voltage value to a side on which the voltage value increases in accordance with the adjustment value.

Figure 13:
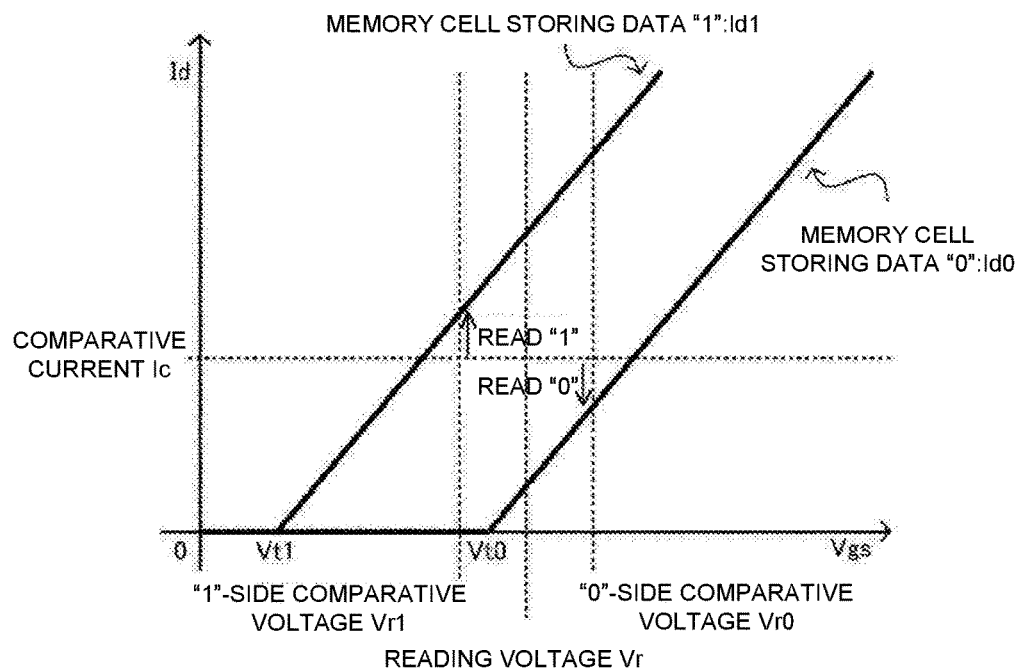
FIG. 13 is a diagram illustrating an example of a relation between Id-Vgs characteristics of a memory cell and reading voltages Vr, Vr1, and Vr0 when the comparative current Ic and the reading voltage Vr are appropriate.

FIG. 13 illustrates an example of a relation between Id-Vgs characteristics of the memory cell 66 and reading voltages Vr, Vr1, and Vr0 when the comparative current Ic and the reading voltage Vr are appropriate. As illustrated in FIG. 13, when the reading voltage Vr1 is applied, a current Id1 flowing through the memory cell 66 storing data having a logic value "1" is equal to or greater than the comparative current Ic1, and accordingly, the sense amplifier 36 determines that the logic value of the read data is "1." In addition, when the reading voltage Vr0 is applied, a current Id0 flowing through the memory cell 66 storing data having a logic value "0" is less than the comparative current Ic, and accordingly, the sense amplifier 36 determines that the logic value of the read data is "0." In this way, as illustrated in FIG. 13, when the comparative current Ic and the reading voltage Vr are appropriate, an actual logic value of data stored in the memory cell 66 and the logic value of read data coincide with each other.

Figure 14:
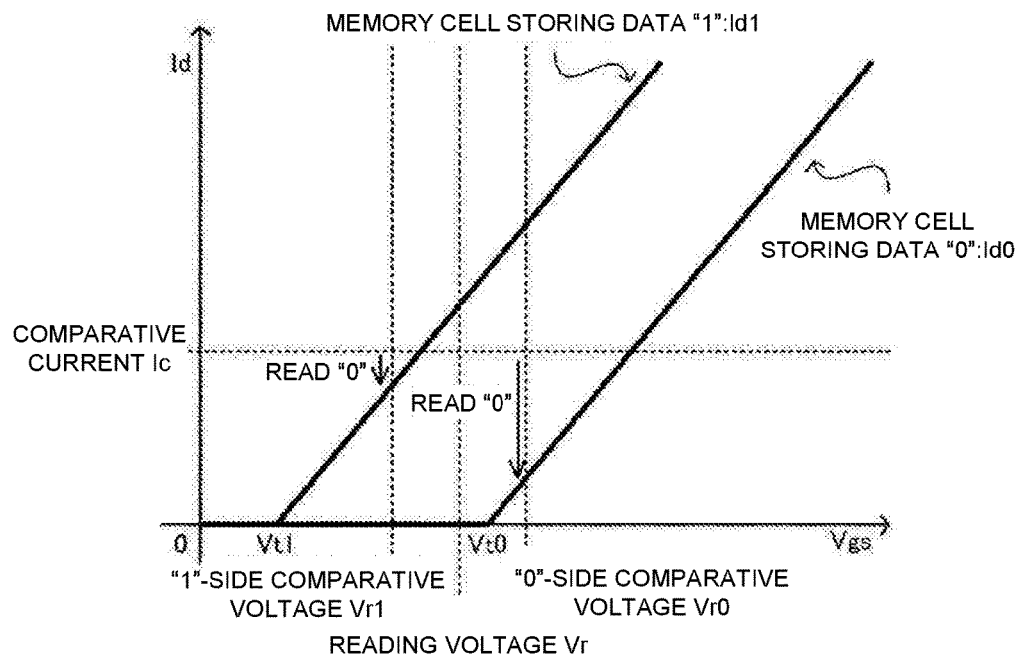
FIG. 14 is a diagram illustrating an example of a relation between Id-Vgs characteristics of a memory cell and reading voltages Vr, Vr1, and Vr0 when the reading voltage Vr has a value smaller than an appropriate value.

FIG. 14 illustrates an example of a relation between Id-Vgs characteristics of the memory cell 66 and reading voltages Vr, Vr1, and Vr0 when the reading voltage Vr has a value smaller than an appropriate value. As illustrated in FIG. 14, when a reading voltage Vr1 is applied, a current Id1 flowing through the memory cell 66 storing data of a logic value "1" is less than the comparative current Ic, and accordingly, the sense amplifier 36 determines that the logic value of the read data is "0." In addition, when a reading voltage Vr0 is applied, a current Id0 flowing through the memory cell 66 storing data of a logic value "0" is less than the comparative current Ic, and accordingly, the sense amplifier 36 determines that the logic value of the read data is "0." In this way, in the case as illustrated in FIG. 14, the actual logic value ("1") of the data stored in the memory cell 66 and the logic value of the read data do not coincide with each other.

Figure 15:
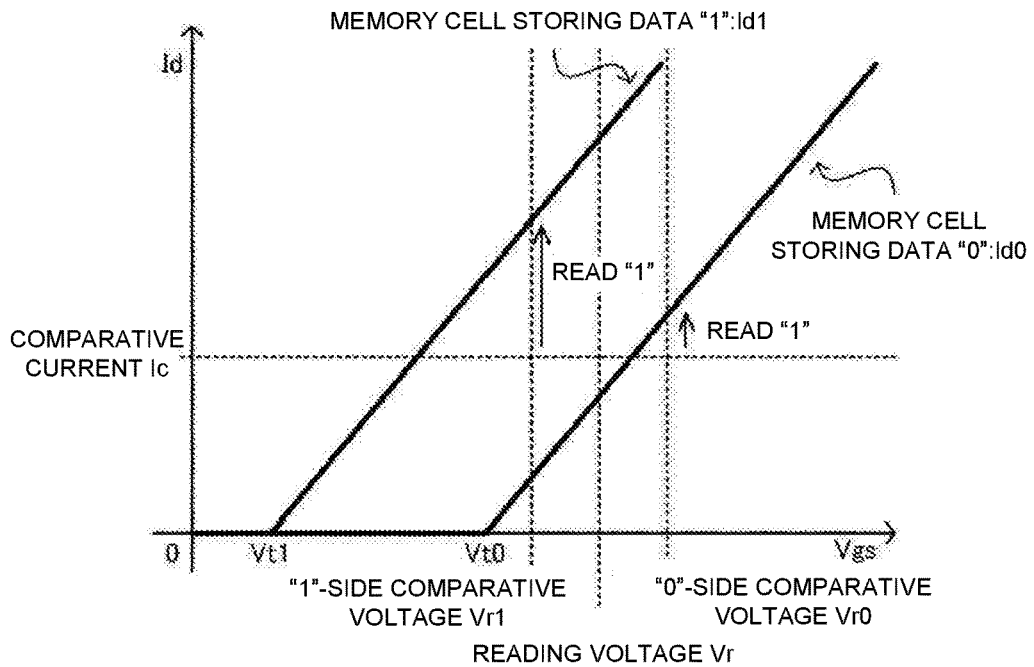
FIG. 15 is a diagram illustrating an example of a relation between Id-Vgs characteristics of a memory cell and reading voltages Vr, Vr1, and Vr0 when the reading voltage Vr has a value larger than an appropriate value.

FIG. 15 illustrates an example of a relation between Id-Vgs characteristics of the memory cell 66 and reading voltages Vr, Vr1, and Vr0 when the reading voltage Vr has a value larger than an appropriate value. As illustrated in FIG. 15, when a reading voltage Vr1 is applied, a current Id1 flowing through the memory cell 66 storing data of a logic value "1" is equal to or greater than the comparative current Ic, and accordingly, the sense amplifier 36 determines that the logic value of the read data is "1." In addition, when a reading voltage Vr0 is applied, a current Id0 flowing through the memory cell 66 storing data of a logic value "0" is equal to or greater than the comparative current Ic, and accordingly, the sense amplifier 36 determines that the logic value of the read data is "1." In this way, in the case as illustrated in FIG. 15, the actual logic value ("0") of the data stored in the memory cell 66 and the logic value of the read data do not coincide with each other.

Figure 16:
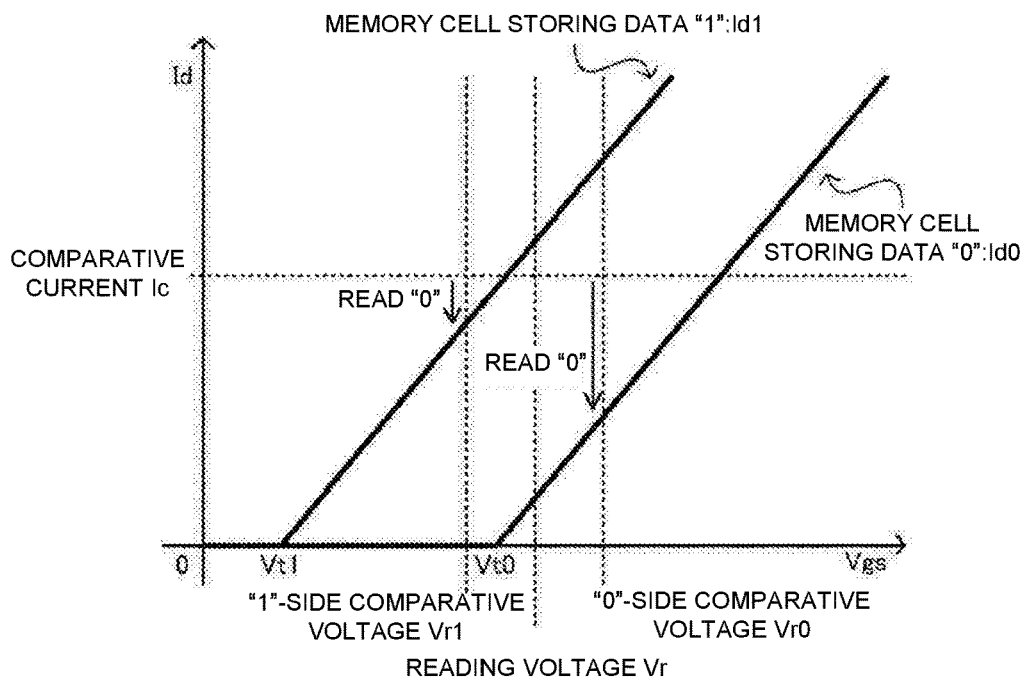
FIG. 16 is a diagram illustrating an example of a relation between Id-Vgs characteristics of a memory cell and reading voltages Vr, Vr1, and Vr0 when the comparative current Ic has a value larger than an appropriate value.

FIG. 16 illustrates an example of a relation between Id-Vgs characteristics of the memory cell 66 and reading voltages Vr, Vr1, and Vr0 when the comparative current Ic has a value larger than an appropriate value. As illustrated in FIG. 16, when a reading voltage Vr1 is applied, a current Id1 flowing through the memory cell 66 storing data of a logic value "1" is less than the comparative current Ic, and accordingly, the sense amplifier 36 determines that the logic value of the read data is "0." In addition, when a reading voltage Vr0 is applied, a current Id0 flowing through the memory cell 66 storing data of a logic value "0" is less than the comparative current Ic, and accordingly, the sense amplifier 36 determines that the logic value of the read data is "0." In this way, in the case as illustrated in FIG. 16, the actual logic value ("1") of the data stored in the memory cell 66 and the logic value of the read data do not coincide with each other.

Figure 17:
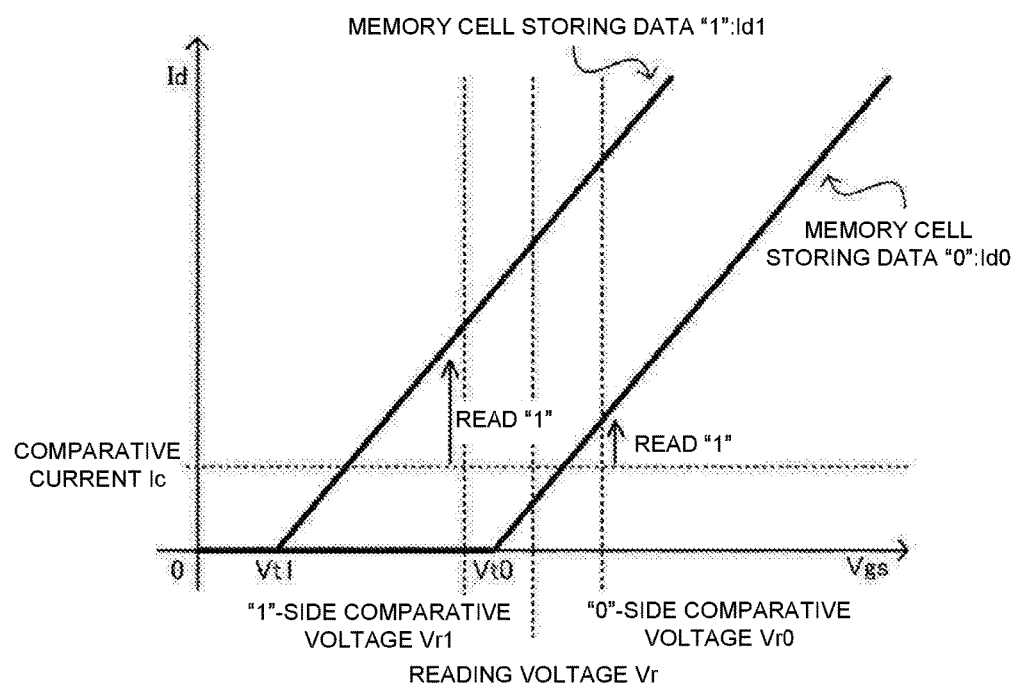
FIG. 17 is a diagram illustrating an example of a relation between Id-Vgs characteristics of a memory cell and reading voltages Vr, Vr1, and Vr0 when the comparative current Ic has a value smaller than an appropriate value.

FIG. 17 illustrates an example of a relation between Id-Vgs characteristics of the memory cell 66 and reading voltages Vr, Vr1, and Vr0 when the comparative current Ic has a value smaller than an appropriate value. As illustrated in FIG. 17, when a reading voltage Vr1 is applied, a current Id1 flowing through the memory cell 66 storing data of a logic value "1" is equal to or greater than the comparative current Ic, and accordingly, the sense amplifier 36 determines that the logic value of the read data is "1." In addition, when a reading voltage Vr0 is applied, a current Id0 flowing through the memory cell 66 storing data of a logic value "0" is equal to or greater than the comparative current Ic, and accordingly, the sense amplifier 36 determines that the logic value of the read data is "1." In this way, in the case as illustrated in FIG. 17, the actual logic value ("0") of the data stored in the memory cell 66 and the logic value of the read data do not coincide with each other.

As described with reference to FIGS. 13 to 17, according to the semiconductor memory device 10 of this embodiment, by adjusting the reading voltage Vr using the adjustment value output from reading voltage adjusting circuit 70, when the actual logic value of the data stored in the memory cell 66 and the logic value (the logic value of the read data) determined by the sense amplifier 36 do not coincide with each other, it can be determined that at least one of the comparative current Ic and the reading voltage Vr is not appropriate.

In addition, similar to the first embodiment, as the adjustment value becomes larger, the actual logic value of the data stored in the memory cell 66 and the logic value (the logic value of the read data) determined by the sense amplifier 36 are less likely to coincide with each other. For this reason, also in this embodiment, as the adjustment value becomes larger, the determination of appropriateness or inappropriateness becomes stricter. The adjustment value, for example, may be determined in accordance with the specification of the memory cell array 20, an allowed range of an error in the reading voltage Vr, an allowed range of an error in the comparative current Ic, and the like.

Next, an initial setting sequence executed in the semiconductor memory device 10 according to this embodiment will be described. While the flow of the initial setting sequence is similar to the flow (see FIG. 3) of the initial setting sequence according to the first embodiment, a part of the operation in each of the processes of Steps S104 and S106 is different from that according to the first embodiment, and thus, operations different from those of the semiconductor memory device 10 according to the first embodiment in each step will be described.

In Step S104, when each setting data of which the setting sequence is n is read from the setting value table 54 and is latched (set) in each data register, in this embodiment, the control circuit 52 latches reading voltage adjustment value setting data in the reading voltage adjustment value setting data register 72. In addition, the control circuit 52 according to this embodiment outputs an adjustment instruction signal used for performing adjustment of the reading voltage to the reading voltage adjusting circuit 70.

In this way, the reading voltage adjusting circuit 70 determines an adjustment value corresponding to the reading voltage adjustment value setting data set in the reading voltage adjustment value setting data register 72 based on the adjustment instruction signal and outputs the adjustment value to the reading voltage generating circuit 38. Meanwhile, the reading voltage generating circuit 38 adjusts (increases or decreases) a reading voltage corresponding to the reading voltage value setting data set in the reading voltage value setting data register 42 by using the adjustment value determined by the reading voltage adjusting circuit 70 to generate an adjusted reading voltage and outputs the adjusted reading voltage to the row decoder 30.

More specifically, the reading voltage generating circuit 38 according to this embodiment generates a reading voltage Vr1 by decreasing (decreasing the voltage value) the reading voltage Vr corresponding to the reading voltage value setting data by using the adjustment value. As described above, the reading voltage Vr1 is used for a comparison with a current flowing through the memory cell 66 storing the determination data having the logic value "1". In addition, the reading voltage generating circuit 38 according to this embodiment generates a reading voltage Vr0 by increasing (increasing the voltage value) the reading voltage Vr corresponding to the reading voltage value setting data by using the adjustment value. As described above, the reading voltage Vr0 is used for a comparison with a current flowing through the memory cell 66 storing the determination data having the logic value "0". Here, the reading voltage Vr1 according to this embodiment is an example of a first reading voltage according to the present disclosure, and the reading voltage Vr0 according to this embodiment is an example of a second reading voltage according to the present disclosure.

In addition, in Step S106, while the control circuit 52 reads the determination data from the known-data storage area 22 of the memory cell array 20, in this embodiment, when determination data having the logic value "1" is read, the row decoder 30 applies a reading voltage Vr1, and the comparison circuit 37 of the sense amplifier 36 compares the comparative current Ic with the current Id1 flowing through the memory cell 66. On the other hand, when determination data having the logic value "0" is read, the row decoder 30 applies a reading voltage Vr0, and the comparison circuit 37 of the sense amplifier 36 compares the comparative current Ic with the current Id0 flowing through the memory cell 66.

In this way, the semiconductor memory device 10 according to this embodiment determines the appropriateness or inappropriateness of the determination data stored in the known-data storage area 22 in the initial sequence. When the logic value of the determination data is "1", the reading voltage generating circuit 38 generates a reading voltage Vr1 acquired by performing adjustment of decreasing the reading voltage Vr based on the adjustment value. The comparison circuit 37 of the sense amplifier 36 compares the current Id1 flowing through the memory cell 66 in which the determination data having the logical value "1" is stored with the comparative current Ic. The sense amplifier 36 determines that the logic value of the read data is "1" when the current Id1 is equal to or larger than the comparative current Ic1 and determines that the logic value of the read data is "0" when the current Id1 is less than the comparative current Ic.

In addition, when the logic value of the determination data is "0", the reading voltage generating circuit 38 generates a reading voltage Vr0 acquired by performing adjustment of increasing the reading voltage Vr based on the adjustment value. The comparison circuit 37 of the sense amplifier 36 compares the current Id0 flowing through the memory cell 66 in which the determination data having the logic value "0" is stored with the comparative current Ic. The sense amplifier 36 determines that the logic value of the read data is "0" when the current Id0 is less than the comparative current Ic and determines that the logic value of the read data is "1" when the current Id0 is equal to or larger than the comparative current Ic.

In both the case in which the logic value of the determination data is "1" and the case in which the logic value of the determination value is "0", when the actual logic value of the determination data and the logic value of the read data determined by the sense amplifier 36 coincide with each other, the control circuit 52 determines that the comparative current Ic and the reading voltage Vr are appropriate.

As described above, the semiconductor memory device 10 according to each embodiment described above includes: the memory cell array 20 including the plurality of memory cells 66 and having the known-data storage area 22 storing determination data in which the determination data is used for determining the appropriateness or inappropriateness of values of the reading voltage applied to the memory cell 66 at the time of reading data stored in the memory cell 66 and the comparative current used for a comparison with the current flowing through the memory cell 66 in accordance with the stored data; the decoder 30 applying a reading voltage to a memory cell to be read 66 in accordance with an address representing the memory cell to be read 66 from which data is to be read; and the sense amplifier 36 including the comparison circuit 37 that outputs a comparison result acquired by comparing the current flowing through the memory cell to be read 66 in accordance with the stored data with the comparative current.

By employing the configuration described above, according to the semiconductor memory device 10 of each embodiment descried above, the appropriateness or inappropriateness of the reading voltage and the comparative current can be determined using the known-data storage area 22, and accordingly, data stored in a memory cell 66 of the memory cell array 20, for example, the initial setting data stored in the memory cell 66 of the initial setting data storage area 24 can be appropriately read.

In addition, according to the semiconductor memory device 10 of each embodiment described above, the appropriateness or inappropriateness is determined using the comparative current or the reading voltage that has been adjusted by the adjustment value. For this reason, according to the semiconductor memory device 10 of each embodiment described above, the reading voltage and the comparative current can be set to have values that are more appropriate than those of a case in which appropriateness or inappropriateness is determined using the comparative current or the reading voltage that has not been adjusted by the adjustment value. Accordingly, the data stored in the memory cell 66 can be read more appropriately.

In addition, while, in the first embodiment described above, a form in which the comparative current adjusted using the adjustment value determined by the comparative current adjusting circuit 46 is used for determination of the appropriateness or inappropriateness has been described, and, in the second embodiment, a form in which the reading voltage adjusted using the adjustment value determined by the reading voltage adjusting circuit 70 is used for determination of the appropriateness or inappropriateness has been described, the present disclosure is not limited thereto.

For example, similar to the first embodiment, in the form in which a comparative current acquired by adjusting the comparative current using the adjustment value is used for the determination of the appropriateness or inappropriateness, instead of the comparative current value setting data and the comparative current adjustment value setting data (see FIG. 4), data corresponding to the comparative current Ic1 and data corresponding to the comparative current Ic0 that have been adjusted using the adjustment value may be stored in the setting value table 54. In such a case, the control circuit 52 may set (latch) data corresponding to the comparative current Ic1 or data corresponding to the comparative current Ic0 in the comparative current value setting data register 44 in accordance with the logic value of read determination data. In addition, the semiconductor memory device 10 of this case, different from the semiconductor memory device 10 (see FIG. 1) according to the first embodiment does not need the comparative current adjusting circuit 46 and the comparative current adjustment value setting data register 48.

In addition, in each embodiment described above, by using the reading voltage Vr and the comparative current Ic determined to be appropriate in the initial setting sequence, the initial setting data is read from the initial setting data storage area 24, and, after the execution of the initial setting sequence, data stored in the memory cell 66 is read using a normal reading voltage and a normal comparative current included in the initial setting data. However, the form is not limited to the form described above, and thus, the reading voltage Vr and the comparative current Ic determined to be appropriate in the initial setting sequence may be used when data stored in the memory cell 66 disposed in an area other than the known-data storage area 22 and the initial setting data storage area 24 is used in addition to the time when the initial setting data is read.

Furthermore, in each embodiment described above, although the memory cell 66 of the memory cell array 20 has been described as a memory cell storing data having a logic value of "1" or "0", a so-called binary memory cell, the memory cell 66 is not limited thereto and, for example, may be a memory cell having multiple values of four or more values.

In addition, in each embodiment described, although the form in which the semiconductor memory device 10 includes the control circuit 52 has been described, the form is not limited to the form described above. For example, an MCU or the like disposed outside the semiconductor memory device 10 may have a part or the whole function of the control circuit 52 described above.

The configurations, the operations, and the like of the semiconductor memory device 10, the memory cell block 20, and the like described in each embodiment described above are examples, and it is apparent that such configurations, operations, and the like may be changed in accordance with the situations within a range not departing from the concept of the invention.

What is claimed is:

1. A semiconductor memory device comprising:
a memory cell array comprising a plurality of memory cells and having a first area and a second area including an initial setting data storage area and a known-data storage area, normal data being stored in the first area, initial setting data used for initial setting being stored in the initial setting data storage area, determination data used for determining appropriateness or inappropriateness of a value of each of a reading voltage applied to a memory cell at the time of reading data stored in the memory cell and a comparative current used for a comparison with a current flowing through a memory cell in accordance with the stored data being stored in the known-data storage area to read the initial setting data;

a decoder applying the reading voltage to a memory cell to be read in accordance with an address representing the memory cell to be read from which data is to be read; and a comparison circuit outputting a comparison result acquired by comparing a current flowing through the memory cell to be read in accordance with the stored data with the comparative current.

2. The semiconductor memory device according to claim 1, further comprising:

a comparative current generating circuit that outputs a comparative current adjusted based on an adjustment value to the comparison circuit as the comparative current when the determination of the appropriateness or inappropriateness is performed, wherein, when the determination of the appropriateness or inappropriateness is performed, the memory cell to be read is set as a memory cell of the known-data storage area.

3. The semiconductor memory device according to claim 2, wherein the determination data includes first data and second data having different logic values, and a current flowing through a memory cell in which the first data is stored is higher than a current flowing through a memory cell in which the second data is stored, wherein the comparative current generating circuit outputs a first comparative current increased based on the adjustment value to the comparison circuit as the comparative current when the memory cell to be read is a memory cell in which the first data is stored and outputs a second comparative current decreased based on the adjustment value to the comparison circuit as the comparative current when the memory cell to be read is a memory cell in which the second data is stored, and wherein the comparison circuit outputs a first comparison result acquired by comparing the first comparative current with the current flowing through the memory cell to be read when the memory cell to be read is a memory cell in which the first data is stored and outputs a second comparison result acquired by comparing the second comparative current with the current flowing through the memory cell to be read when the memory cell to be read is a memory cell in which the second data is stored.

4. The semiconductor memory device according to claim 3, further comprising:

a control circuit that determines the reading voltage and the comparative current before adjustment using the adjustment value are appropriate when the first comparison result indicates that the current flowing through the memory cell to be read is equal to or greater than the first comparative current, and the second comparison result indicates that the current flowing through the memory cell to be read is less than the second comparative current.

5. The semiconductor memory device according to claim 1, further comprising:

a reading voltage generating circuit that outputs a reading voltage adjusted based on an adjustment value to the decoder as the reading voltage when the determination of the appropriateness or inappropriateness is performed, wherein, when the determination of the appropriateness or inappropriateness is performed, the memory cell to be read is set as a memory cell of the known-data storage area.

6. The semiconductor memory device according to claim 5, wherein the determination data includes first data and second data having different logic values, and a current flowing through a memory cell in which the first data is stored is higher than a current flowing through a memory cell in which the second data is stored, wherein the reading voltage generating circuit outputs a first reading voltage decreased based on the adjustment value to the decoder as the reading voltage when the memory cell to be read is a memory cell in which the first data is stored and outputs a second reading voltage increased based on the adjustment value to the decoder as the reading voltage when the memory cell to be read is a memory cell in which the second data is stored, and wherein the comparison circuit outputs a first comparison result acquired by comparing the current flowing through the memory cell to be read with the comparative current when the memory cell to be read is a memory cell in which the first data is stored and outputs a second comparison result acquired by comparing the current flowing through the memory cell to be read with the comparative current when the memory cell to be read is a memory cell in which the second data is stored.

7. The semiconductor memory device according to claim 6, further comprising:

a control circuit that determines the comparative current and the reading voltage before adjustment using the adjustment value are appropriate when the first comparison result indicates that the current flowing through the memory cell to be read is equal to or greater than the comparative current, and the second comparison result indicates that the current flowing through the memory cell to be read is less than the comparative current.

8. The semiconductor memory device according to claim 1, wherein the initial setting data includes at least one of a value of a reading voltage and a value of a comparative current, wherein, when the value of the reading voltage is included in the initial setting data, the decoder, after the initial setting data is read from the initial setting data storage area, applies a reading voltage corresponding to the value of the reading voltage included in the initial setting data as the reading voltage to the memory cell, and wherein, when the value of the comparative current is included in the initial setting data, the comparison circuit, after the initial setting data is read from the initial setting data storage area, compares a comparative current corresponding to the value of the comparative current included in the initial setting data as the comparative current with the current flowing through the memory cell to be read.

9. A method for reading data in a semiconductor memory device comprising: a memory cell array comprising a plurality of memory cells and having a first area and a second area including an initial setting data storage area and a known-data storage area, normal data being stored in the first area, initial setting data used for initial setting being stored in the initial setting data storage area, determination data used for determining appropriateness or inappropriateness of a value of each of a reading voltage applied to a memory cell at the time of reading data stored in the memory cell and a comparative current used for a comparison with a current flowing through a memory cell in accordance with the stored data being stored in the known-data storage area to read the initial setting data; a decoder applying the reading voltage to a memory cell in accordance with an address representing the memory cell from which data is to be read; and a comparison circuit that outputs a comparison result acquired by comparing a current flowing through the memory cell in accordance with the stored data with the comparative current, the data reading method comprising:
   performing the determination of the appropriateness or inappropriateness based on the comparison result at the time of reading the determination data;
   setting the reading voltage determined to be appropriate as a reading voltage to be applied by the decoder; and
   setting the comparative current determined to be appropriate as a comparative current to be compared by the comparison circuit.

\* \* \* \* \*